United States Patent
Wen et al.

[19]

[11] Patent Number: 6,143,610
[45] Date of Patent: *Nov. 7, 2000

[54] METHOD FOR FABRICATING HIGH-DENSITY SEMICONDUCTOR READ-ONLY MEMORY DEVICE

[75] Inventors: Jemmy Wen; Jih-Wen Chou, both of Hsinchu, Taiwan

[73] Assignee: United Microelectronics Corp., Hsinchu

[ * ] Notice: This patent is subject to a terminal disclaimer.

[21] Appl. No.: 09/022,392

[22] Filed: Feb. 12, 1998

Related U.S. Application Data

[62] Division of application No. 08/862,429, May 23, 1997, abandoned.

[30] Foreign Application Priority Data

Jan. 6, 1997 [TW] Taiwan ................................. 86100079

[51] Int. Cl.[7] .............................................. H01L 21/8246
[52] U.S. Cl. ............................................. 438/275; 438/237
[58] Field of Search ................................ 438/275–278, 438/237

[56] References Cited

U.S. PATENT DOCUMENTS

| | | | |
|---|---|---|---|
| 5,825,069 | 10/1998 | Wen | 257/390 |
| 5,843,824 | 12/1998 | Chou et al. | 438/275 |
| 5,874,339 | 2/1999 | Chang | 438/275 |
| 5,891,777 | 4/1999 | Chang | 438/275 |

*Primary Examiner*—Jey Tsai
*Attorney, Agent, or Firm*—Finnegan, Henderson, Farabow, Garrett & Dunner, L.L.P.

[57] ABSTRACT

A semiconductor read-only memory (ROM) device is provided and includes an array of diode-based memory cells for storing binary data. Whether a memory cell of the ROM device is set to a permanently-ON or OFF state, depends upon whether the memory cell is formed with a junction diode, wherein the presence of a junction diode in the memory cell causes the memory cell to be set to a permanently-ON state. Formation of the junction diode includes the step of forming a plurality of parallel-spaced first diffusion regions of a semiconductor type, to serve as a plurality of bit lines. An insulating layer is then formed to cover the first diffusion regions. A plurality of contact windows are formed at predefined locations of the insulating layer where a first group of memory cells, set to a permanently-ON state, are formed. The unexposed portions of the first diffusion regions are associated with a second group of memory cells that are set to a permanently-OFF state. The method further includes the step of doping the exposed portions of the first diffusion regions with impurities to form a plurality of second diffusion regions of another semiconductor type within the first diffusion regions, and thus, forming the junction diode. A plurality of conductive layers serving as word lines are then formed over the insulating layer to intersect with the bit lines.

10 Claims, 4 Drawing Sheets

METHOD FOR FABRICATING HIGH-DENSITY SEMICONDUCTOR READ-ONLY MEMORY DEVICE

This is a division of application Ser. No. 08/862,429, filed May 23, 1997, abandoned which is incorporated herein by reference.

BACKGROUND OF THE INVENTION

1. Field of the Invention

The present invention relates generally to semiconductor memory devices, and more particularly, to a method for fabricating a high-density semiconductor read-only memory (ROM) device having an array of diode-based memory cells for permanent storage of binary data.

2. Description of Related Art

Read-only memory (ROM) is a nonvolatile semiconductor memory used in computer and microprocessor systems for permanently storing programs and data that are repeatedly used, such as BIOS (Basic Input/Output System, used in operating systems of personal computers). ROM manufacturing involves very complicated and time-consuming processes requiring costly equipment and material. Therefore, customers typically first define the data to be permanently stored in ROMs, and then provide the data to the ROM manufacturer for programming into the ROMs.

A conventional ROM device comprises an array of MOSFETs (metal-oxide semiconductor field-effect transistors), wherein each MOSFET is associated with a single memory cell of the ROM device. The binary data stored in each MOSFET-based memory cell depends upon a particular electrical characteristic of the memory cell, such as the threshold voltage.

If a high concentration impurity material dopes a channel of the conventional MOSFET memory cell, the MOSFET memory cell will be set to a threshold voltage lower than a gate voltage, so to effectively set the MOSFET memory cell in a permanently-ON state representing the storage of a first binary digit, such as, for example, "0." On the other hand, if the channel of the MOSFET memory cell is not doped with impurities, the MOSFET memory cell will have a threshold voltage higher than the gate voltage, so to effectively set the MOSFET memory cell to a permanently-OFF state representing the storage of a second binary digit, such as, for example "1."

The conventional ROM device, as shown in FIG. 1, includes a plurality of parallel-spaced diffusion regions, serving as a plurality of buried bit lines 12a, 12b, 12c, beneath a plurality of field oxide layers 200. The device further includes a plurality of word lines (WL1, WL2) 18, 18' that intersect bit lines 12a, 12b, 12c at right angles. The intersections between bit lines 12a, 12b, 12c and word lines WL1, WL2 are where the memory cells of the ROM device are formed. For example, a first memory cell 16a is formed on word line WL2 between bit lines 12a, 12b; a second memory cell 16b is formed on word line WL2 between bit lines 12b, 12c; a third memory cell 16c is formed on word line WL1 between bit lines 12a, 12b; and a fourth memory cell 16d is formed on word line WL1 between bit lines 12b, 12c. The binary data permanently stored in memory cells 16a, 16b, 16c, 16d depend upon the concentration of associated diffusion regions. For example, N+ regions shown in FIG. 1 signify that associated memory cells 16a, 16d are set to a permanently-ON state, while memory cells 16b, 16c are set to a permanently-OFF state.

FIG. 2 is a perspective view of the conventional ROM device of FIG. 1 with a front showing a cross-sectional view taken through line II—II of FIG. 1. As shown in FIG. 2, the conventional ROM device comprises a P-type silicon substrate 10 having bit lines 12a, 12b, 12c and overlaying field oxide layers 200 formed thereon, and a thin insulating layer 14 having word lines (WL1, WL2) 18, 18' formed thereon.

FIG. 3 is a circuit diagram of the conventional ROM device shown in FIG. 1. As shown, two word lines WL1 and WL2 access the binary data stored in four memory cells 16a, 16b, 16c, 16d via three bit lines (BL1, BL2, BL3) 12a, 12b, 12c. In this example, first and fourth memory cells 16a, 16d are in a permanently-ON state, and second and third memory cells 16b, 16c are in a permanently-OFF state.

One problem with the conventional ROM device is that the MOSFET-based memory cells are large, and thus, require a substantial portion of the wafer. Attempts at reducing the size of the MOSFET-based memory cells, results in a short-channel effect which causes a leakage current in the conventional ROM device. Moreover, the threshold voltage of the MOSFET-based memory cells restricts the operating voltage of the conventional ROM device. Use of a low operating voltage causes a low current in the bit lines, preventing the sense amplifiers of the conventional ROM device from distinguishing whether the accessed data is a "0" or a "1".

SUMMARY OF THE INVENTION

It is therefore an object of the present invention to provide a method for fabricating a ROM device having an increased integration of memory cells on a wafer surface without reducing the size of the semiconductor components of the ROM device, and which can operate at a low voltage.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a ROM device including: a first semiconductor type semiconductor substrate; a plurality of parallel-spaced first diffusion regions of a second semiconductor type formed in the substrate in a first direction, the first diffusion regions serving as a plurality of bit lines on which an array of memory cells are defined; an insulating layer formed over the substrate, the insulating layer being formed with a plurality of contact windows connected to select areas of the first diffusion regions where a first group of the memory cells, set to a permanently-ON state, are located, wherein the unexposed portions of the first diffusion regions are associated with a second group of the memory cells that are set to a permanently-OFF state; a plurality of second diffusion regions of the first semiconductor type, each of the plurality of second diffusion regions being formed in one of the first diffusion regions to form a junction diode in each of the ON-state memory cells; and a plurality of parallel-spaced conductive layers, serving as a plurality of word lines, provided over the insulating layer in a second direction intersecting the bit lines, wherein the conductive layers fill all of the contact windows in the insulating layer to provide electrical contact with all of the second diffusion regions.

In accordance with another aspect, the present invention comprises a method for fabricating a ROM device comprising the steps of: preparing a semiconductor substrate of a first semiconductor type; forming a plurality of parallel-spaced first diffusion regions of a second semiconductor type on the substrate in a first direction, the first diffusion regions serving as a plurality of bit lines on which an array of memory cells are defined; forming an insulating layer over the substrate covering all of the first diffusion regions; forming a plurality of contact windows in the insulating layer to expose select locations on the first diffusion regions where a first group of the memory cells, set to a permanently-ON state, are located, wherein the unexposed portions of the first diffusion regions are associated with a second group of the memory cells that are set to a permanently-OFF state; using the insulating layer as a mask, performing an ion-implantation process to dope an impurity material of the first semiconductor type into the exposed portions of the first diffusion regions to form a plurality of second diffusion regions of the first semiconductor type in the associated first diffusion regions, each of the second diffusion regions and its associated first diffusion region in combination comprising a junction diode; and forming a plurality of substantially parallel-spaced conductive layers, serving as a plurality of word lines, over the insulating layer in a second direction intersecting the bit lines, the conductive layers filling all of the contact windows in the insulating layer to provide electrical contact with all of the second diffusion regions associated with the ON-state memory cells.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principles of the invention. In the drawings.

DETAILED DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

The preferred embodiment of the ROM device of the present invention includes an array of diode-based memory cells for storing binary data. Use of diode-based memory cells increases the data storage capacity of the ROM device provided on a wafer having limited surface area.

Figure 1:
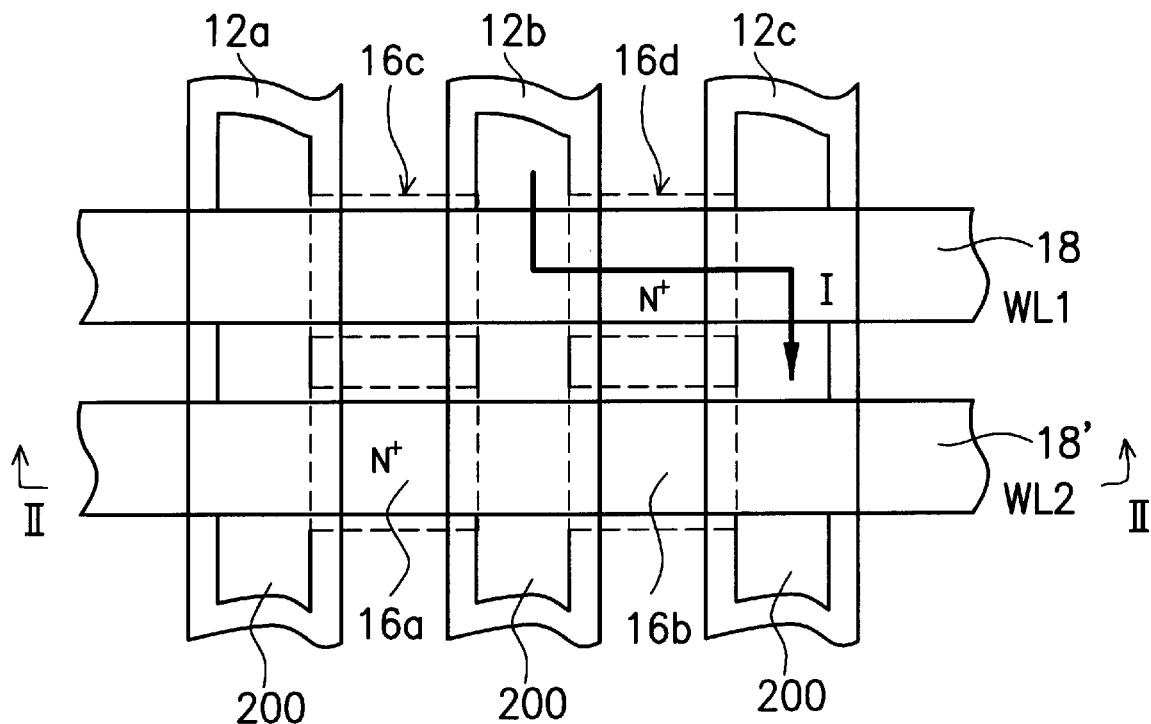
FIG. 1 is a top view of a conventional ROM device.
Figure 2:
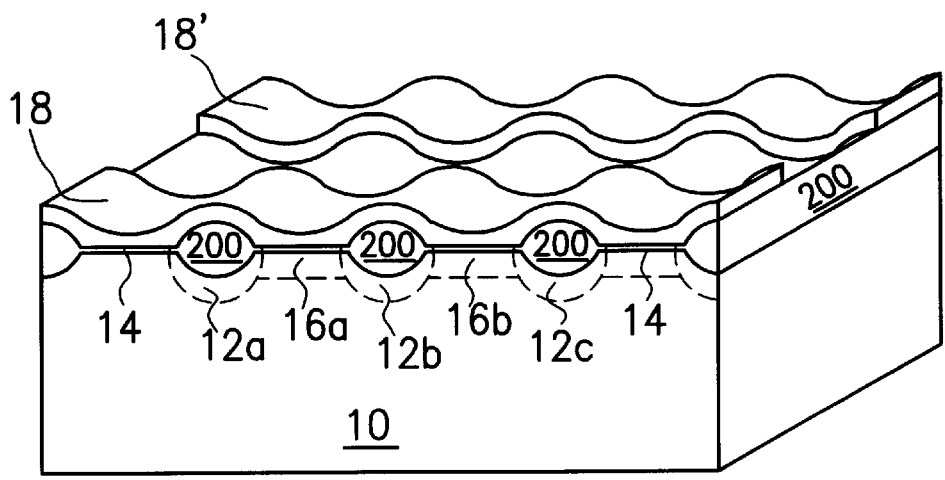
FIG. 2 is a perspective diagram of the conventional ROM device of FIG. 1 taken along line II—II.
Figure 3:
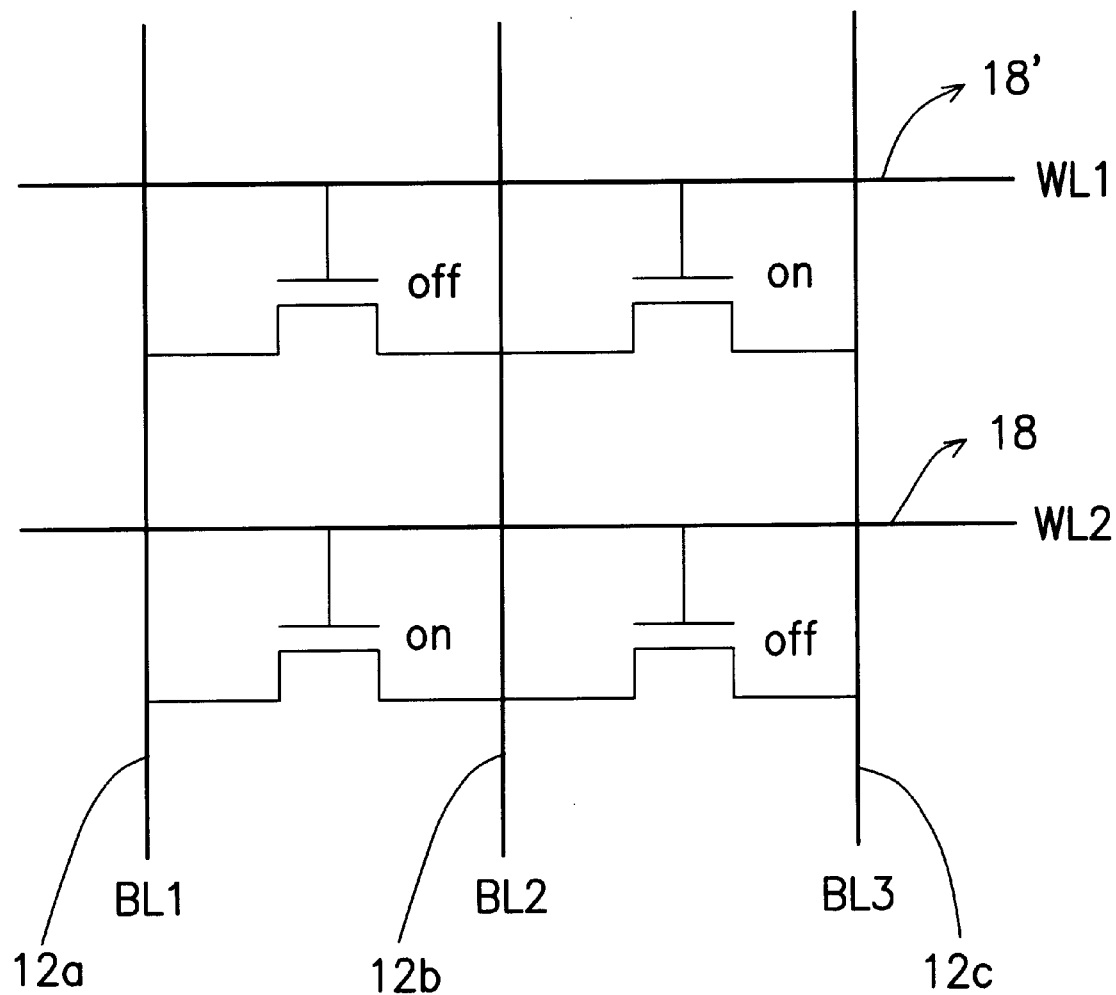
FIG. 3 is a circuit diagram of the conventional ROM device of FIG. 1.
Figure 4A:
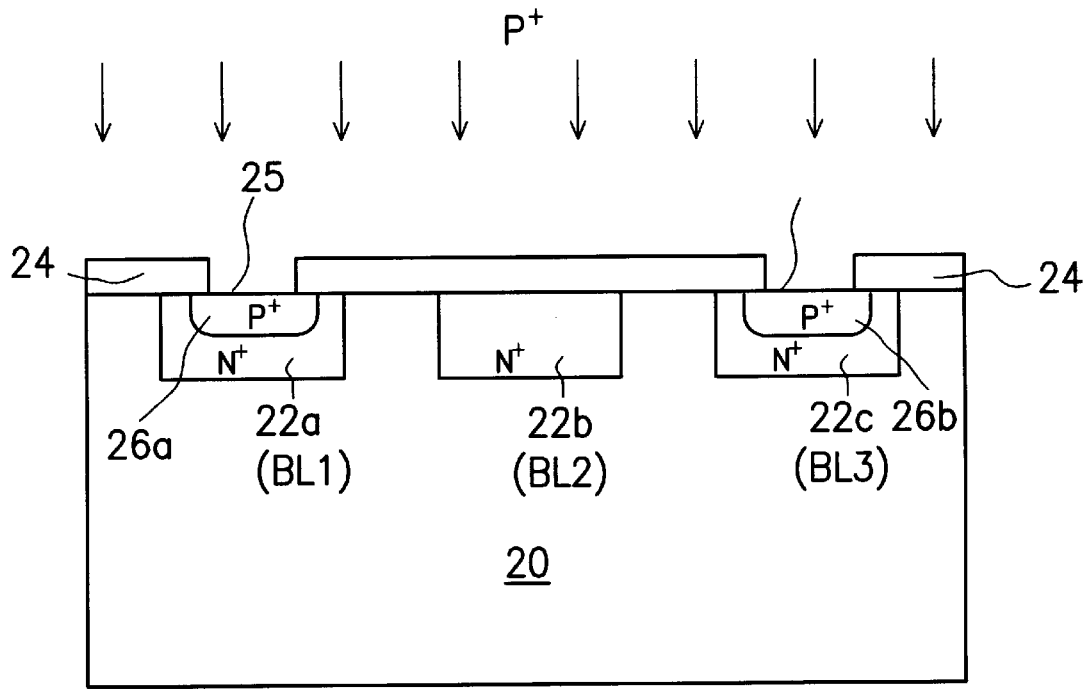
FIGS. 4A and 4B are cross-sectional views showing the steps of the method for fabricating the ROM device in accordance with an embodiment of the present invention.

Referring to FIG. 4A, the method includes the step of preparing a semiconductor substrate 20 of a first semiconductor type, such as a P-type silicon substrate. A first ion-implantation process dopes an impurity material of a second semiconductor type, such as N-type arsenic (As) or phosphorus, into selected areas of substrate 20, forming a plurality of parallel-spaced N+ diffusion regions. For ease of illustration, only three of the N+ diffusion regions are shown in FIG. 4A and are respectively labeled with reference numerals 22a, 22b, 22c. However, the number of N+ diffusion regions can be set to any desired number, depending upon the application of ROM device. N+ diffusion regions 22a, 22b, 22c serve as a plurality of bit lines BL1, BL2, BL3 on which an array of diode-based memory cells are defined.

The method also includes the subsequent step of forming an insulating layer 24, such as a layer of silicon dioxide, over the entire top surface of the device, and selectively removing portions of insulating layer 24 to form a plurality of contact windows 25 exposing first select locations on N+ diffusion regions 22a, 22b, 22c where a first group of the memory cells, set to a permanently-ON state, are located. By contrast, the unexposed N+ diffusion regions are associated with a second group of the memory cells to be set to a permanently-OFF state. In FIG. 4A, for example, N+ diffusion regions 22a, 22c (bit lines BL1 and BL3, respectively) are exposed through contact windows 25 in insulating layer 24, and N+ diffusion region 22b (bit line BL2) is unexposed. Furthermore, the width of each contact window 25 is smaller than the width of each N+ diffusion region 22a, 22b, 22c.

Using insulating layer 24 as a mask, a second ion-implantation process dopes an impurity material of the first semiconductor type, such as P-type boron, boron fluoride, or boron ethane, into the exposed portions of N+ diffusion regions 22a, 22b, 22c. In the second ion-implantation process, the impurity ions bombard the wafer with a lower energy but with a higher concentration than the impurity ions used in the first ion-implantation process. The second ion-implantation process forms a shallow-junction P+ diffusion region in each exposed N+ diffusion region. For example, a P+ diffusion region 26a forms in N+ diffusion region 22a and another P+ diffusion region 26b forms in N+ diffusion region 22c. P+ diffusion regions 26a, 26b and their associated N+ diffusion regions 22a, 22c in combination comprise a junction diode having a forward bias of about 0.7 V (volts) or greater. An inverse breakdown voltage and an inverse leakage current of the junction diode are controlled by adjusting the ratio of the concentration of the N-type impurity material in N+ diffusion regions 22a, 22c to the concentration of the P-type impurity material in P+ diffusion regions 26a, 26b.

Figure 4B:
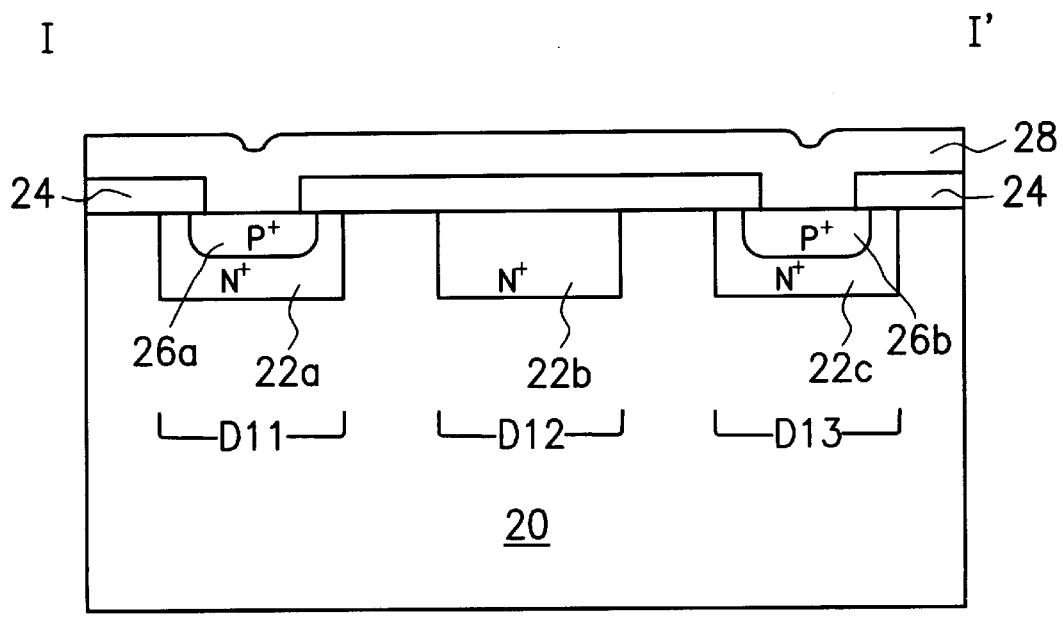
Figure 5A:
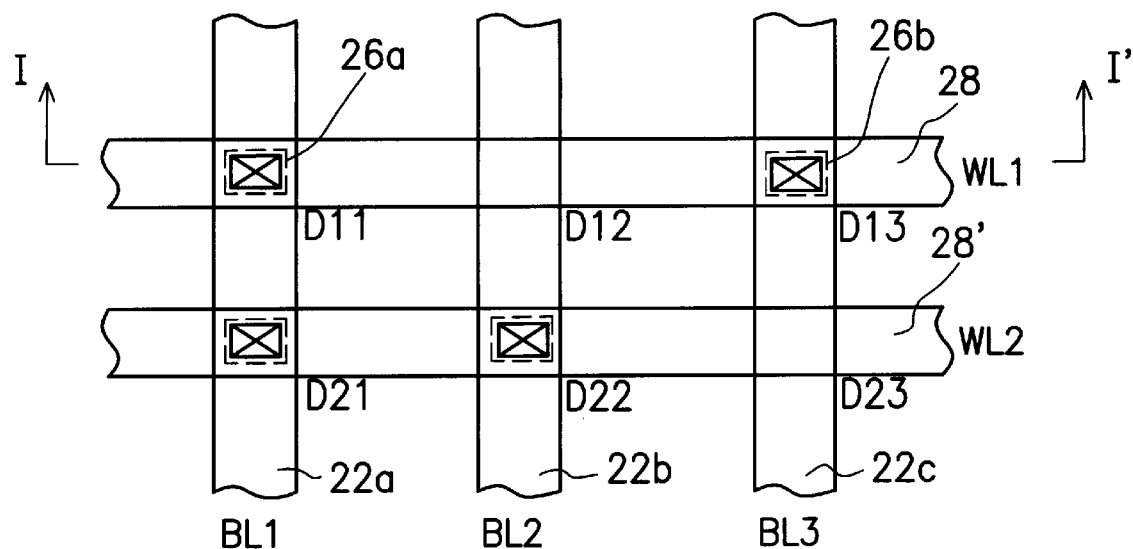
FIG. 5A is a top view of the ROM device of FIG. 4B.

Referring to FIGS. 4B and 5A, the method includes the subsequent step of forming a plurality of parallel-spaced conductive layers over the device. For ease of illustration, only two conductive layers are shown in FIG. 5A, respectively designated by reference numerals 28, 28', and only one conductive layer is shown in FIG. 4B, indicated by reference numeral 28. Conductive layers 28, 28' fill contact windows 25 to provide electrical contact with P+ diffusion regions 26a, 26b formed in N+ diffusion regions 22a, 22c, respectively. Conductive layers 28, 28' serve as word lines WL1, WL2 for the ROM device, wherein word lines WL1, WL2 intersect bit lines BL1, BL2, BL3 at approximately a right angle. The intersections of bit lines BL1, BL2, BL3 and word lines WL1, WL2 define an array of locations where the memory cells of the ROM device are formed. If a memory cell location includes a junction diode, that memory cell is set to a permanently-ON state. Otherwise, the memory cell is set to a permanently-OFF state.

As shown in FIG. 5A, for example, three memory cells D11, D12, D13 are defined along word line WL1, and another three memory cells D21, D22, D23 are defined along word line WL2. The crossed boxes indicate that the memory cells D11, D13, D21, D22 include a junction diode. Therefore, memory cells D11, D13, D21, D22 are set to a permanently-ON state. In contrast, memory cells D12, D23 are not marked with a crossed box, and, therefore, are set to a permanently-OFF state.

Figure 5B:
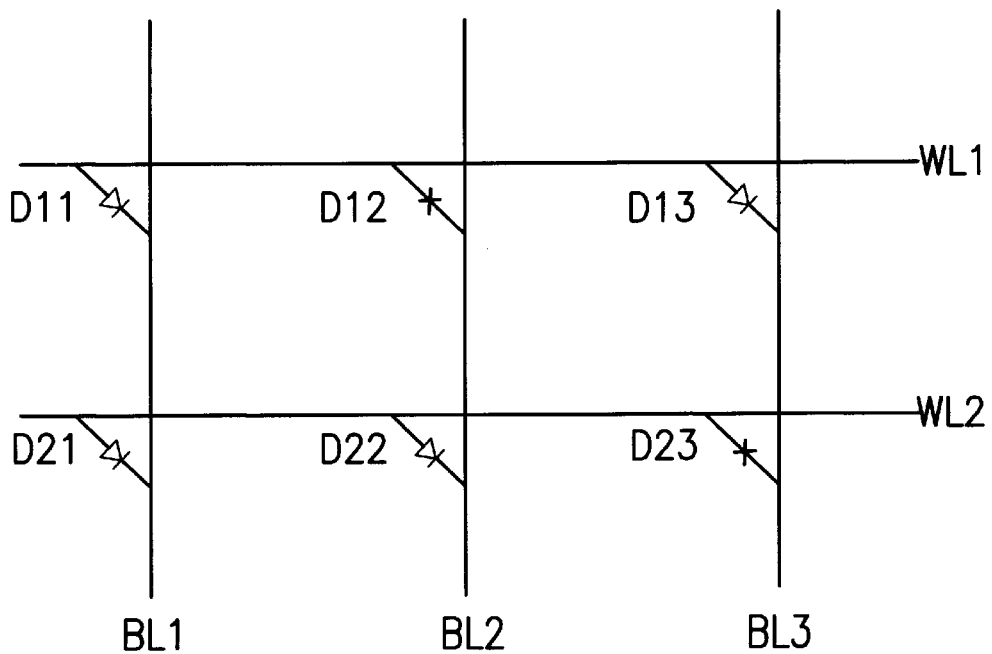
FIG. 5B is a circuit diagram of the ROM device of FIG. 5A.

An equivalent circuit diagram of the ROM device of FIG. 5A is illustrated in FIG. 5B. As shown, the data stored in memory cells D11, D12, D13, D21, D22, D23 can be accessed by sequentially applying a positive electrical potential to word lines WL1, WL2 and then detecting the currents in bit lines BL1, BL2, BL3. By way of example and not limitation, reading the data stored in ON-state memory cell D11 requires detecting the current in bit line BL1 when electrical potential is applied to word line WL1. In this example, the current detected in bit line BL1 indicates that the binary data stored in memory cell D11 is a first binary value, such as "1." By contrast, failure to detect current in bit line BL2, when electrical potential is applied to word line WL1, indicates that memory cell D12 is set to a permanently-OFF state and that the binary data stored in memory cell D12 is a second binary value, such as "0."

The ROM device of the present invention has an increased integration of memory cells on a limited wafer surface. Moreover, the ROM device can function at a low operating voltage while still producing an adequate current for sensing. Thus, the ROM device of the present invention eliminates the problem of conventional MOSFET-type memory cells production of a small, undetectable current when functioning at a low operating voltage. In addition, the ON/OFF state of the memory cells of the present invention depends upon whether a contact window is provided to form the P+doped region. This feature of the present invention is advantageous over the conventional MOSFET-type memory cells having ON/OFF states dependent upon the complex process of adjusting the doping concentration of associated diffusion regions.

It will be apparent to those skilled in the art that various modifications and variations can be made in the ROM device of the present invention and in construction of this ROM device without departing from the scope or spirit of the invention. As an example, in the foregoing description, the first semiconductor type is P-type while the second semiconductor type is N-type. However, the first semiconductor type can be N-type while the second semiconductor type can be P-type. In the latter case, first diffusion regions 22a, 22b, 22c would be P+diffusion regions while second diffusion regions 26a, 26b would be N+ diffusion regions.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating a ROM device comprising the steps of:

preparing a semiconductor substrate of a first semiconductivity type;

forming a plurality of parallel-spaced first diffusion regions of a second semiconductivity type on the substrate in a first direction, the first diffusion regions serving as a plurality of bit lines on which an array of memory cells are defined, the semiconductor substrate and the first diffusion regions defining a planar surface;

forming an insulating layer over the substrate covering all of the first diffusion regions;

forming a plurality of contact windows in the insulating layer to expose select locations on the first diffusion regions where a first group of the memory cells, set to a permanently-ON state, are located, wherein the unexposed portions of the first diffusion regions are associated with a second group of the memory cells that are set to a permanently-OFF state;

using the insulating layer as a mask, performing an ion-implantation process to dope an impurity material of the first semiconductivity type into the exposed portions of the first diffusion regions to form a plurality of second diffusion regions of the first semiconductivity type in the associated first diffusion regions, each of the second diffusion regions and its associated first diffusion region in combination comprising a junction diode; and forming a plurality of parallel-spaced conductive layers, serving as a plurality of word lines, over the insulating layer in a second direction intersecting the bit lines, the conductive layers filling all of the contact windows in the insulating layer to provide electrical contact with all of the second diffusion regions associated with the ON-state memory cells.

2. The method of claim 1, wherein the first semiconductivity type is P-type and the second semiconductor type is N-type.

3. The method of claim 2, wherein the first semiconductivity type is N-type and the second semiconductor type is P-type.

4. The method of claim 2, wherein the first diffusion regions are N+ diffusion regions and the second diffusion regions are P+ diffusion regions.

5. The method of claim 3, wherein the first diffusion regions are P+ diffusion regions and the second diffusion regions are N+ diffusion regions.

6. The method of claim 5, wherein the insulating layer comprises a layer of silicon dioxide.

7. The method of claim 1, wherein the ON-state memory cells store a binary digit of 1.

8. The method of claim 7, wherein the ON-state memory cells store a binary digit of 0.

9. The method of claim 1, wherein the OFF-state memory cells store a binary digit of 1.

10. The method of claim 9, wherein the OFF-state memory cells store a binary digit of 0.

* * * * *